(12) United States Patent
Li et al.

(10) Patent No.: US 11,838,011 B2
(45) Date of Patent: *Dec. 5, 2023

(54) TEMPERATURE-SENSITIVE TRANSISTOR GATE DRIVER

(71) Applicant: Texas Instruments Incorporated, Dallas, TX (US)

(72) Inventors: Xiong Li, Allen, TX (US); Toru Tanaka, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 168 days.

This patent is subject to a terminal disclaimer.

(21) Appl. No.: 17/495,968

(22) Filed: Oct. 7, 2021

(65) Prior Publication Data

US 2022/0029618 A1 Jan. 27, 2022

Related U.S. Application Data

(63) Continuation of application No. 15/969,034, filed on May 2, 2018, now Pat. No. 11,171,640.

(51) Int. Cl.

| G01K 7/16 | (2006.01) |
|---|---|
| H03K 17/14 | (2006.01) |
| H03K 17/16 | (2006.01) |
| H02P 27/08 | (2006.01) |
| G01K 7/01 | (2006.01) |

(52) U.S. Cl.
CPC ............ *H03K 17/14* (2013.01); *G01K 7/16* (2013.01); *H03K 17/168* (2013.01); *G01K 7/01* (2013.01); *H02P 27/08* (2013.01)

(58) Field of Classification Search
CPC ........ H03K 17/14; H03K 17/168; G01K 7/16; G01K 7/01; H02P 27/08
See application file for complete search history.

(56) References Cited

U.S. PATENT DOCUMENTS 4,164,129 A * 8/1979 Stueber ................. F25D 13/067
62/380
4,258,310 A 3/1981 Asakawa et al.
(Continued)

FOREIGN PATENT DOCUMENTS

| EP | 4117181 A1 * | 1/2023 | ............. H03K 3/011 |
| EP | 4164129 A1 * | 4/2023 | ............... H02H 3/06 |

(Continued)

*Primary Examiner* — Gail Kaplan Verbitsky
(74) *Attorney, Agent, or Firm* — Ray A. King; Frank D. Cimino

(57) ABSTRACT

A system comprises a gate driver that is configured to couple to a transistor disposed in a transistor module via a first pin. The gate driver comprises a duty cycle measurement circuit having a first input terminal and a first output terminal, the first input terminal coupled to a second pin via an isolator. The duty cycle measurement circuit comprises a flip-flop, a counter, a shift register, and a comparator. The system comprises an analog to digital converter circuit having a second input terminal, a second output terminal, and a reference terminal, the second input terminal coupled to a third pin configured to couple to a temperature-sensitive device disposed in the transistor module, the second output terminal coupled to a fourth pin via the isolator, and the reference terminal coupled to the first output terminal.

20 Claims, 7 Drawing Sheets

(56) References Cited

U.S. PATENT DOCUMENTS

| | | | |
|---|---|---|---|
| 4,498,040 | A | 2/1985 | Tatsushi et al. |
| 5,298,851 | A | 3/1994 | DeNardis |
| 5,374,881 | A | 12/1994 | Post et al. |
| 7,607,827 | B2 | 10/2009 | Karikomi et al. |
| 9,030,054 | B2 | 5/2015 | Jacobson et al. |
| 9,515,584 | B2 | 12/2016 | Koller et al. |
| 9,608,623 | B1 | 3/2017 | Kandah et al. |
| 9,673,809 | B1 * | 6/2017 | Kandah ............... H02P 27/08 |
| 10,192,795 | B2 | 1/2019 | Mori |
| 10,369,867 | B2 | 8/2019 | Nagasaka et al. |
| 10,972,088 | B1 | 4/2021 | Barrenscheen et al. |
| 2003/0197245 | A1 | 10/2003 | Zhang |
| 2010/0066328 | A1 | 3/2010 | Shimizu et al. |
| 2013/0257177 | A1 | 10/2013 | Jacobson et al. |
| 2014/0226381 | A1 | 8/2014 | Sasaki et al. |
| 2014/0355651 | A1 | 12/2014 | Hong et al. |
| 2015/0010041 | A1 | 1/2015 | Koeppl et al. |
| 2015/0130477 | A1 | 5/2015 | Berland et al. |
| 2015/0211938 | A1 | 7/2015 | Imakiire et al. |
| 2015/0333675 | A1 | 11/2015 | Barbosa et al. |
| 2016/0004638 | A1 | 1/2016 | Lewsey |
| 2016/0126944 | A1 * | 5/2016 | Limvorapun ...... H03K 17/0822 327/109 |
| 2018/0165212 | A1 | 6/2018 | Lin |
| 2018/0372553 | A1 | 12/2018 | Ewanchuk et al. |
| 2019/0250046 | A1 * | 8/2019 | Sun ................... G01R 31/2619 |
| 2019/0341917 | A1 * | 11/2019 | Li ..................... H03K 17/0828 |
| 2019/0356253 | A1 | 11/2019 | Kruzel |
| 2020/0049569 | A1 | 2/2020 | Arens et al. |
| 2020/0400491 | A1 | 12/2020 | Tanaka et al. |

FOREIGN PATENT DOCUMENTS

| | | | | |
|---|---|---|---|---|
| WO | WO-2010118406 | A2 * | 10/2010 | ........ H02M 3/33515 |
| WO | WO-2013111863 | A1 * | 8/2013 | ............. G01K 13/00 |

\* cited by examiner

TEMPERATURE-SENSITIVE TRANSISTOR GATE DRIVER

CROSS-REFERENCE TO RELATED APPLICATIONS

The present application claims priority to U.S. patent application Ser. No. 15/969,034, which was filed May 2, 2018, entitled "Temperature-Sensitive Transistor Gate Driver," which Application is hereby incorporated herein by reference in its entirety.

SUMMARY

In accordance with at least one example a system, comprises a gate driver, which further comprises multiple pins, the gate driver configured to couple to a transistor disposed in a transistor module via a first pin of the multiple pins. In at least one example, the gate driver also comprises a duty cycle measurement circuit having a first input terminal and a first output terminal, the first input terminal coupled to a second pin of the multiple pins via a galvanic isolator. In at least one example, the duty cycle measurement circuit comprises a flip-flop coupled to the first input terminal; a counter coupled to the flip-flop; a shift register coupled to the counter; and a comparator coupled to the shift register. In at least one example, the system comprises an analog to digital converter (ADC) circuit having a second input terminal, a second output terminal, and a reference terminal, the second input terminal coupled to a third pin of the multiple pins, the third pin configured to couple to a temperature-sensitive device disposed in the transistor module, the second output terminal coupled to a fourth pin of the multiple pins via the galvanic isolator, and the reference terminal coupled to the first output terminal.

In accordance with at least another example, a system, comprises a gate driver configured to couple to a transistor disposed in a transistor module and to a controller unit. The gate driver comprises a duty cycle measurement circuit configured to receive from the controller unit a first signal that controls the transistor turn-on and turn-off, and to generate a second signal that is at least partially based on a turn-on time of the first signal. The gate driver also comprises an analog to digital converter (ADC) circuit coupled to the duty cycle measurement circuit and configured to couple to a temperature-sensitive device disposed in the transistor module; and receive a third signal from the temperature-sensitive device and, in response to receiving the second signal, generate a fourth signal based on the third signal.

In accordance with at least yet another example, a method for detecting a temperature of a power transistor, comprises receiving a first PWM cycle having a first turn-on time and a second PWM cycle having a second turn-on time from a controller unit; generating, in a gate driver and during the second PWM cycle, a first signal at least partially based on the first turn-on time; and generating, upon receiving the first signal, a data frame in the gate driver by sampling a potential difference of a temperature sensing device disposed in a transistor module.

BRIEF DESCRIPTION OF THE DRAWINGS

For a detailed description of various examples, reference will now be made to the accompanying drawings in which.

DETAILED DESCRIPTION

Figure 1:
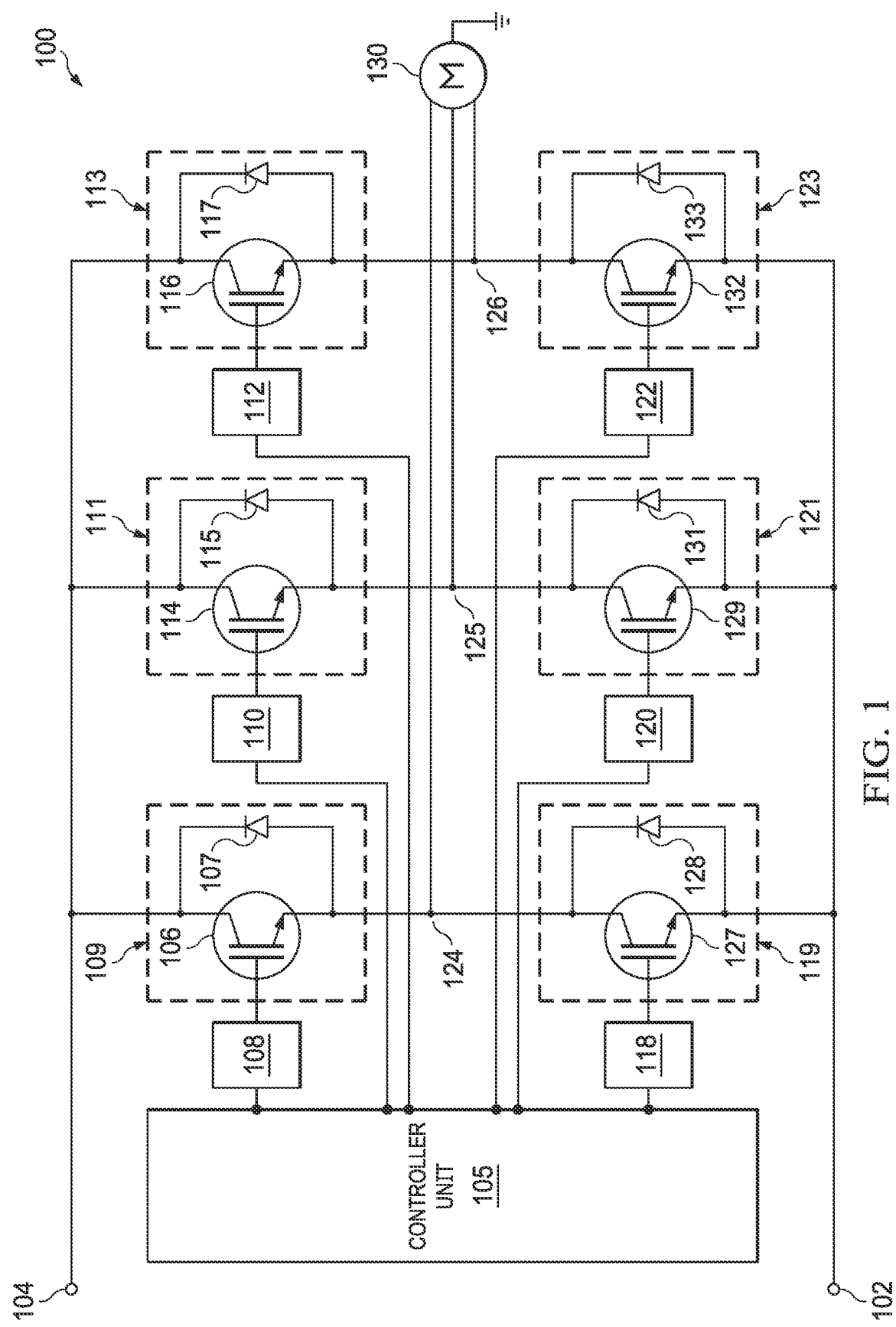
FIG. 1 is a schematic diagram of an illustrative three-phase inverter system, in accordance with various examples.

Transistors are often driven using controller units. Controller units generate pulse width modulation (PWM) signals (e.g., having pulse amplitudes of 3V-5V) to drive the transistors. In some cases, the pulse (or "turn-on time") amplitudes associated with the PWM signals are insufficient to drive the associated transistors. In such cases, a gate driver is used to amplify the PWM signals, and the outputs of the gate drivers are subsequently used to drive the transistors. Stated another way, a gate driver acts as a power amplifier and amplifies a low-power input signal from a controller unit (e.g., controller integrated circuit (IC)) and produces a corresponding high-current drive input for the gate of the associated transistor. Such transistors are also referred to as high-power transistors because they are employed in high-voltage applications. High-power transistors typically drive a high-power load, such as a motor with a 600V-1200V voltage rating used in automotive and industrial applications. Examples of such high-power transistors include an insulated gate bipolar transistor (IGBT) or a power metal-oxide-semiconductor-field-effect-transistor (MOSFET).

In some cases, high-power transistors are implemented in the context of a three-phase architecture. Typically, a controller unit provides PWM signals to multiple power transistors such that the PWM signals turn on and turn off the power transistors in a coordinated manner to supply phase-offset load currents to the load to maintain the desired output. For example, a three-phase inverter includes three pairs of transistors (two transistors for each phase), with the gate driver of each transistor coupled to a controller unit. The output of each transistor pair is connected to one of three load terminals. The controller unit coordinates the turning-on/-off operation of the three pairs of transistors by sending PWM signals to each of the gate drivers. In some cases, gate drivers are implemented as dedicated integrated circuits (ICs), discrete transistors, or transformers.

When a transistor is switched on or off, it may not instantly switch from a non-conducting state (e.g., turn-off) to a conducting state (e.g., turn-on), and may briefly support both a high voltage state and conduct a high current. Stated another way, when a transistor switches from an off-state to an on-state, the transistor bears the supply voltage and the load current. In some cases, in addition to the load current, the transistor bears the reverse recovery current of the antiparallel diode of the complementary diode. Consequently, when gate current is applied to a transistor to cause it to switch, a finite amount of heat is generated in the transistor which can, in some cases, be high enough to damage or destroy the transistor. Therefore, it is desirable to keep the switching time as short as possible to mitigate switching loss.

To protect the transistor from further damage, various protection mechanisms may be implemented to monitor the operating temperature of the power transistors. These protection mechanisms help maintain the operating temperatures of the power transistors in the safe operating area (SOA). In some cases, each of the high-power transistors used in high-voltage applications (e.g., voltages higher than 65V) are stored in a housing module (also referred to as a transistor module). Some temperature protection mechanisms include directly monitoring the temperature of the power transistors by positioning a temperature-sensitive device (e.g., diode) in the housing module of the power transistor, so that the operating temperature of the power transistor can be measured (or estimated). The voltage drop across these temperature-sensitive devices can be interpreted as the junction temperature of the power transistor in the controller unit. This type of direct temperature sensing offers advantages over other techniques, including better accuracy and faster dynamic response. Accurate temperature sensing can help operate the power transistors within the target temperature range with fewer errors.

Such temperature-sensing solutions are not without drawbacks. The high-speed turning-on and turning-off operation of power transistors causes strong electromagnetic interference (EMI), which leads to current and voltage spikes in the power transistors. These EMI events constitute switching noise and can cause temperature sensing errors in high-voltage, multi-phase converter systems. In order to achieve high accuracy, the power transistor switching noise should be substantially removed (or decoupled) from temperature sensing mechanisms. The middle point of a PWM signal turn-on time (or "pulse") is typically a low-noise area of the signal as there are no switching events, and so it can be used as the time at which the temperature of the transistor is sampled. This sampling point is ascertained by the controller unit, and when the sampling point is reached, a dedicated start of conversion (SOC) signal is generated in the controller unit and sent to the gate driver to trigger temperature sampling. A dedicated channel is used to transfer the SOC signal across an isolation barrier that is present in the gate driver, which adds to the system cost. Additionally, extra circuitry is implemented in the controller unit to generate the SOC signal. Furthermore, the signal propagation delay from the controller unit and the gate driver may cause sampling errors. A new temperature sensing scheme is desired to overcome the various disadvantages described above.

Accordingly, at least some aspects of the present disclosure relate to a gate driver to drive a power transistor, such as an IGBT. In at least some examples, the gate driver controls the generation of the SOC signal, which is configured to facilitate, in conjunction with a temperature-sensitive device, the sampling of the temperature of the power transistor. The SOC signal, in at least some examples, is dynamically generated in the gate driver by measuring the turn-on time/pulse of the PWM signal and calculating a point of low EMI noise (e.g., mid-point of the measured turn-on time). In at least some of the examples, the calculated SOC signal is then used to sample a voltage difference across the temperature-sensitive device. The voltage difference, in at least some examples, is translated into a digital signal using an analog to digital converter (ADC) circuit. The resulting digital signal, in some examples, is transported to the controller unit using a communication interface (e.g., serial peripheral interface (SPI)). The digital signal is interpreted in the controller unit as a temperature value, thus monitoring the temperature of the power transistor dynamically. In some examples, a timing signal to index the pulses of the PWM signal is concatenated to the signal generated by the ADC circuit and transported to the controller unit via SPI. This combined signal can optionally be used to synchronize the ADC data with the PWM signal.

Referring now to FIG. 1, a schematic diagram of an illustrative three-phase inverter system 100 is shown. The three-phase inverter system 100, in some examples, is configured to convert direct current (DC) to three-phase alternating current (AC), which further generates rotating magnetic fields in the motor 130 and facilitates rotating the motor 130. In at least some examples, the transistor modules 109, 111, 113, 119, 121, and 123 include power transistors 106, 114, 116, 127, 129, and 132, respectively. In the three-phase inverter system 100, the load (e.g., motor 130) is coupled to the output terminals 124, 125, and 126, with each output terminal representing the output of a pair of power transistors. For example, the output terminal 124 is the output of the power transistors 106, 127; the output terminal 125 is the output of the power transistors 114, 129; and the output terminal 126 is the output of the power transistors 116, 132. The output terminals 124, 125, and 126 collectively yield a three-phase AC output. In at least some examples, each of the power transistors 106, 114, 116, 127, 129, and 132 employs an anti-parallel diode (or freewheeling diode) 107, 115, 117, 128, 131, and 133, respectively, across it to conduct current in the reverse direction (e.g., current traveling away from the load). The gate terminal of each of the power transistors 106, 114, 116, 127, 129, and 132 is coupled to the gate drivers 108, 110, 112, 118, 120, and 122, respectively, such that each of the gate drivers 108, 110, 112, 118, 120, and 122 is configured to provide a gate signal that turns on or turns off its corresponding transistor.

During operation, to convert the DC input received at the terminals 102 and 104 to a three-phase AC output at the output terminals 124, 125, and 126, the controller unit 105 provides each of the gate drivers 108, 110, 112, 118, 120, and 122 with PWM signals such that the pairs of power transistors 106, 114; 116, 127; and 129, 132 operate in a complementary manner, which facilitates the DC to 3-phase AC conversion and further generates a rotating magnetic field in the motor 130.

In at least some examples, each of the transistor modules 109, 111, 113, 119, 121, and 123 includes at least one temperature-sensitive device (not expressly shown in FIG. 1), for example, a diode. As noted above, the diodes 107, 115, 117, 128, 131, and 133 are freewheeling diodes, and in examples, the temperature-sensitive devices (not expressly shown) are separate diodes that are positioned in the transistor modules.

In some examples, gate drivers 108, 110, 112, 118, 120, and 122 are configured to amplify the received PWM signals and drive associated power transistors. In some examples, each of the gate drivers 108, 110, 112, 118, 120, and 122 has an architecture that includes a galvanic isolator, which isolates a high voltage side (that is coupled to the load) from a low voltage side (that is coupled to the controller unit 105). In some examples, the gate drivers 108, 110, 112, 118, 120, and 122 are characterized by high current capability (e.g., 5A) making the gate drivers suitable for high-power applications. In some examples, the gate drivers 108, 110, 112, 118, 120, and 122 also provide various protection functions (or facilitate provision of the protection functions), such as desaturation detection, Miller clamp, and temperature protection. In some examples, each of the gate drivers 108, 110, 112, 118, 120, and 122 includes an SPI interface (not expressly depicted in FIG. 1) that is configured to send SPI signals (e.g., SPI data frames) to the controller unit 105.

In at least one example, the controller unit 105 is any circuitry suitable to provide PWM signals that, as noted above, are used to turn the power transistors on and off, and is configured to receive SPI signals from the gate drivers 108, 110, 112, 118, 120, and 122. The controller unit 105 may also be configured to process the received SPI signals to determine temperature data encoded in the SPI signals. In some examples, both SPI and PWM signals are communicated through separate channels (not expressly shown in FIG. 1). In at least some examples, the controller unit 105 can be a microcontroller that is designed for closed-loop control applications, such as industrial drives and servo motor control.

In some examples, as further described below, the gate drivers 108, 110, 112, 118, 120, and 122 include a duty cycle measurement circuit (not expressly shown in FIG. 1) that is configured to receive PWM signals from the controller unit 105, calculate the duty cycle of the associated power transistor, and generate an SOC signal so as to sample the temperature of the associated transistor. The gate drivers 108, 110, 112, 118, 120, and 122 are further configured to transmit the sampled temperatures of the transistors to the controller 106 using the SPI interface.

In some examples, the durations of turn-on times/pulses in a PWM signal are assumed to be the same to facilitate sampling of temperatures in low-noise conditions during turn-on times (e.g., during mid-points of the turn-on times, as explained above). However, in some cases, the durations of turn-on times in a PWM signal may differ. In such cases, one or more temperature readings may be obtained at undesired times—for instance, during portions of turn-on times that are undesirably close to switching points or during turn-off times. Such temperature data should be discarded because, for instance, such data may have been corrupted by switching noise. To facilitate the identification of such temperature data, in some examples, the gate drivers 108, 110, 112, 118, 120, and 122 are configured to concatenate timing signals to index the turn-on times of the PWM signals that drive the power transistors with the sampled signals. In some examples, this combined signal (containing sampled and timing signals) is transported to the controller unit 105 and is used to synchronize the sampled signal with the correct PWM turn-on time to facilitate the identification and removal of erroneous temperature data.

Figure 2A:
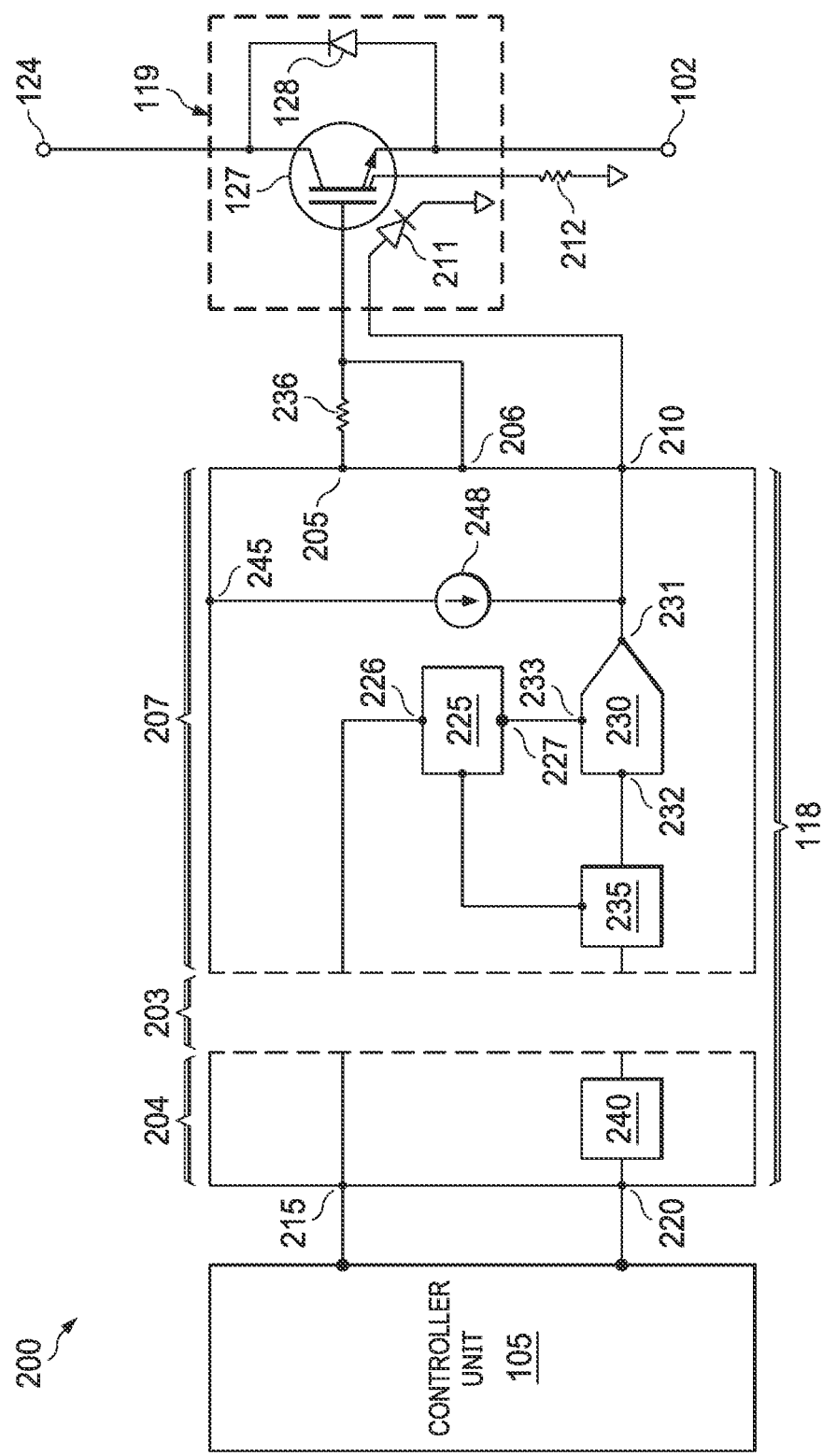
FIG. 2(a) is a schematic diagram of an illustrative power transistor coupled to a gate driver and a controller unit, in accordance with various examples.

Referring now to FIG. 2(a), a schematic diagram 200 depicts an illustrative power transistor 127 disposed in the transistor module 119 that couples to the gate driver 118. The gate driver 118, in turn, is further coupled to the controller unit 105. For simplicity's sake, the description below is directed toward the gate driver 118, the power transistor 127, and the transistor module 119. However, the description of FIG. 2(a) is valid for the gate drivers 108, 110, 112, 120, and 122 and their corresponding transistor modules 109, 111, 113, 121, and 123, respectively, including power transistors 106, 114, 116, 129, and 132, respectively.

In some examples, the gate driver 118 includes pins 205, 206, 210, 215, 220, 245. The gate driver 118 couples to, or is configured to couple to, the power transistor 127 disposed in the transistor module 119 via the pin 205. For example, the pin 205 couples to the power transistor 127 via a resistor 236 and delivers a gate current to the power transistor 127 in response to a PWM signal provided by the controller unit 105. The pin 205 couples to a circuitry (not expressly depicted in FIG. 2(a)) that is configured to drive the transistor 127. In some examples, the power transistor 127 also couples to the gate driver 118 via the pin 206, which acts as the feedback pin receiving operating information of the power transistor 127. For example, the pin 206 is used to implement a Miller clamp function to prevent the power transistor 127 from falsely turning on.

The transistor module 119, in some examples, includes one or more of the following (not expressly shown in FIG. 2(a)): a thermally conductive insulation layer, a copper foil, a heat spreader, leads, and molded resin. In some examples, the transistor module 119 also includes the power transistor 127 (e.g., IGBT), the free-wheeling diode 128, and a diode 211. The freewheeling diode 128 (which is also referred to as an antiparallel diode) is employed across the power transistor 127 to provide a path to current when the load (not expressly shown in FIG. 2(a)) coupled to the power transistor 127 is inductive in nature. The diode 211 is disposed in the transistor module 119 such that it is affected by, and is thus used to detect, a change in temperature of the power transistor 127. For example, the resistance of the diode 211 alters with a change in temperature, which, as further described below, is detected by the gate driver 118. In one example, the power transistor 127 is an IGBT. In such a case, the emitter terminal of the IGBT is coupled to the terminal 102 receiving the DC voltage, and the collector terminal is coupled to the output terminal 124. The body of the power transistor 127 is grounded via the resistor 212.

As noted above, the gate driver 118 includes galvanic isolator 203, which separates high-voltage side 207 of the gate driver 118 that couples to the power transistor 127, and the low-voltage side 204 that couples to the controller unit 105. The galvanic isolator 203 is integrated into the gate driver 118 to protect the circuit elements disposed in the low-voltage side 204 from interference induced from the high-voltage side 207. In some examples, the galvanic isolator 203 includes capacitors. In other examples, the galvanic isolator 203 includes inductors. In other examples, the galvanic isolator 203 includes opto-isolators, which transfer electrical signals between the low-voltage side 204 and the high-voltage side 207 using light.

In some examples, the low-voltage side 204 includes an SPI interface 240 that is configured to send data between the gate driver 118 and the controller unit 105. In at least one example, the controller unit 105 provides PWM signals to the gate driver 118 via the pin 215 and receives the SPI signal from the SPI interface 240 via the pin 220. In some examples, the high-voltage side 207 includes a duty cycle measurement circuit 225 having an input terminal 226 and an output terminal 227, where the input terminal 226 couples to the pin 215. The duty cycle measurement circuit 225 is configured to receive the PWM signal from the controller unit 105 through the galvanic isolator 203 via the input terminal 226 and to generate an SOC signal at least in part based on a period value (e.g., turn-on time) of the PWM signal. For example, as noted above, the mid-point of a PWM turn-on time/pulse is a point of low EMI noise. Therefore, in some examples, the duty cycle measurement circuit 225 calculates the mid-point of the PWM turn-on time and generates an SOC signal at the output terminal 227 accordingly.

The high-voltage side 207 of the gate driver 118 further includes an analog to digital converter (ADC) circuit 230 having an input terminal 231, an output terminal 232, and a reference terminal 233. The input terminal 231 further couples to, or is configured to couple to, the diode 211 disposed in the transistor module 119 via the pin 210. The output terminal 232 couples to the pin 220 through the SPI interface 240, an adding unit 235, and the galvanic isolator 203. The output of the adding unit 235 is coupled to the SPI interface 240 and the output terminal 232 of the ADC circuit 230 is coupled to the adding unit 235. The reference terminal 233 is coupled to the output terminal 227.

The input terminal 231 is coupled to a current source 248, which, when turned on, generates a constant current source to bias the diode 211. In some examples, the current source 248 couples to the pin 245, which may be a voltage source pin that is configured to receive a finite (e.g., 5V) voltage. In some examples, the current source 248 includes transistor circuitry (e.g., a field effect transistor with its gate terminal coupled to its source terminal), which provides a current (or constant current) in the event that the transistor circuitry reaches saturation. For example, when a voltage is provided at the pin 245, the transistor circuitry of the current source 248 reaches a state such that it behaves as a current source. Thus, when a voltage is provided at the pin 245, a current flows from the current source 248 toward the diode 211.

As further described below, the ADC circuit 230 is configured to generate an ADC data frame at the output terminal 232 based on the temperature value of the transistor 127, which is calculated by monitoring the potential across the diode 211. As further described below, in some examples, the ADC data frame is generated by sampling the potential difference across the diode 211 upon receiving the SOC signal by the duty cycle measurement circuit 225. The adding unit 235 is configured to receive a timing signal indexed to the PWM signal turn-on times from the duty cycle measurement circuit 225 and the ADC data frame. The adding unit 235 is further configured to concatenate the timing signal into the ADC data frame. For example, the ADC data frame is a 16-bit output, and 10 of these bits are reserved for the temperature value sampled by the ADC circuit 230. Thus, the output of the ADC circuit 230 has 10 bits populated with the digital representation of the temperature value sampled by the ADC circuit 230 and the remaining 6 bits are populated (or, in other words, concatenated) in the adding unit 235 by a digital representation of an index number of the PWM signal that facilitates generating the SOC signal.

Figure 2B:
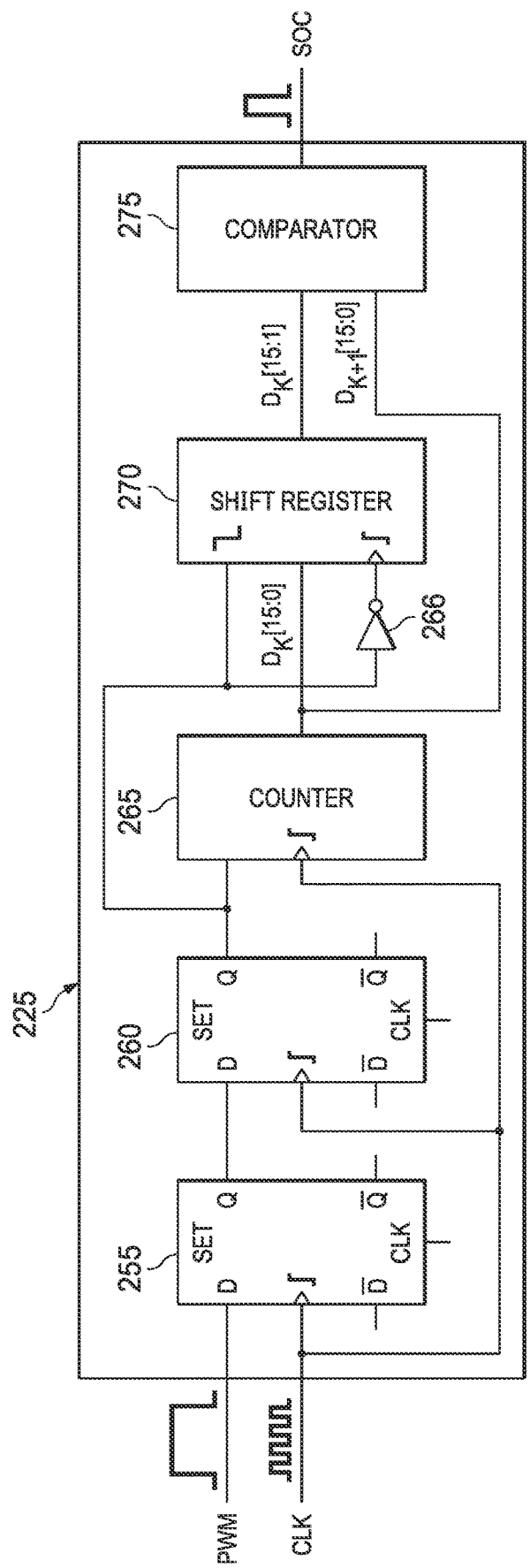
FIG. 2(b) is an illustrative duty cycle measurement circuit, in accordance with various examples.

In at least one example, the duty cycle measurement circuit 225 is any circuitry suitable for finding a point during a PWM turn-on time where there is minimum (e.g., substantially zero) noise (or, in other words, highest signal to noise ratio). In some examples, such a point is approximately the middle point of the duration of the PWM turn-on time. Referring now to FIG. 2(b), an example duty cycle measurement circuit 225 is shown. The duty cycle measurement circuit 225 includes flip-flops 255, 260 that are coupled to each other and are running on the same clock signal. The flip-flops 255, 260, in this example, are D-flip-flops. The output of the flip-flop 255 acts as the input to the flip-flop 260. The duty cycle measurement circuit 225 further includes a counter 265 that is also running on the same clock signal as the flip-flops 255, 260. In some examples, the input to the counter 265 is the output of the flip-flop 260. The duty cycle measurement circuit 225 also includes a shift register 270 which is a cascade of flip-flops (not expressly shown). The clock signal for the shift register 270 is the inverted output of the flip-flop 260, which is obtained by coupling the inverter 266 between the output of the flip-flop 260 and the shift register 270. The input of the shift register 270 is the output of the flip-flop 260. In some examples, the shift register 270 shifts the input bits right, in essence, dividing the input by two. The duty cycle measurement circuit 225 also includes a comparator 275 that receives the output of the shift register 270 and compares it to the output of the counter 265 to produce the SOC signal.

Advantageously, generation of the SOC signal by the duty cycle measurement circuit 225 in the gate driver 118 makes use of a dedicated SOC channel between the controller unit 105 and the gate driver 118 expendable. Thus, the overall cost and space requirements of the system are reduced by avoiding using additional circuitry.

Figure 2C:
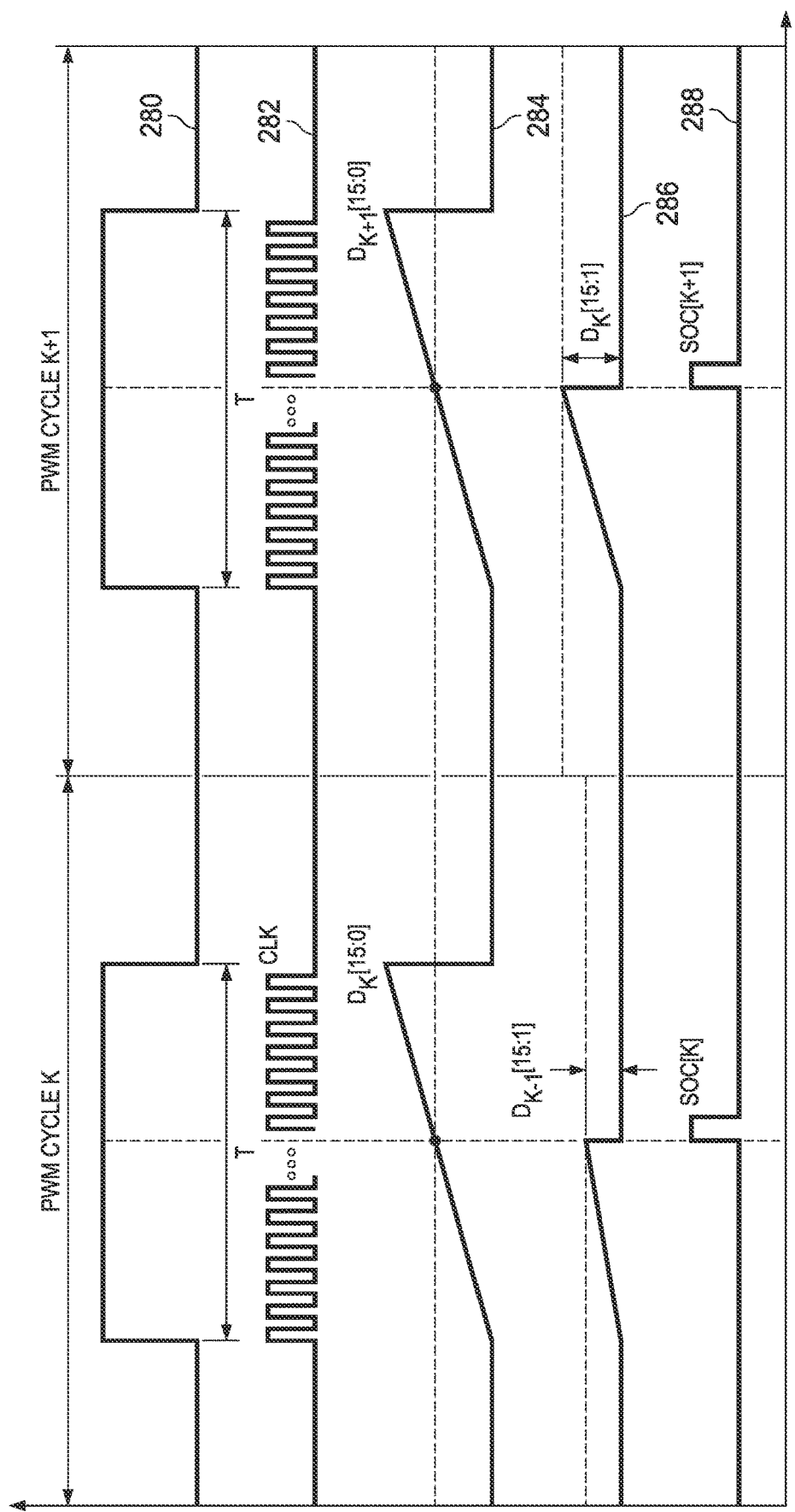
FIG. 2(c) is a timing diagram of the illustrative duty cycle measurement circuit of FIG. 2(b), in accordance with various examples.

The steady state operation of the duty cycle measurement circuit 225 is now described using FIG. 2(b) and FIG. 2(c). FIG. 2(c) depicts a timing diagram of the illustrative duty cycle measurement circuit 225. A graph 280 depicts a PWM cycle K turn-on time ("pulse") having a duration T. Such a pulse is input at the flip-flop 255 via the pin D and the flip-flop 255 outputs a logic high ("1") signal at the pin Q each time the PWM signal is high. Since the flip-flop 260 is running on the same clock (numeral 282) as the flip-flop 255 and receives the output of the flip-flop 255 as input, the output of the flip-flop 260 is a logic high ("1") signal per PWM signal turn-on time, making the output of the flip-flop 255 similar to the output of the flip-flop 260. The output of the flip-flop 260 is received by the counter 265, which increases its count value per clock signal for every logic high signal received by the flip-flop 260 (graph 284 of FIG. 2(c)). The count value is denoted as $D_k[15:0]$. As noted above, the clock for the shift register 270 is the inverted output of the flip-flop 260 and the input of the shift register 270 is the output of the flip-flop 260. The shift register 270 is configured to shift the input bits to the right, meaning that the shift register is dividing the input by two, which is the signal output by the shift register (graph 286 of FIG. 2(c)), denoted as $D_k[15:1]$. The duty cycle measurement circuit 225 also includes a comparator 275 that receives the output of the shift register 270 ($D_K[15:1]$) and compares it to the output of the counter 265 ($D_{K+1}[15:0]$) to produce the SOC signal (graph 288 of FIG. 2(c)), which is based on the turn-on time of the previous PWM cycle, $D_K[15:0]$. For example, for K=2, the comparator 275 generates the SOC signal once the counter reaches the reference value, which is half of the counter value of the previous PWM cycle K−1 (PWM cycle 1 (not expressly depicted in FIG. 2(c))). Similarly, for PWM cycle K+1, the comparator 275 generates an SOC signal once the counter 265 reaches half of the counter value of the PWM cycle K (PWM cycle 2), meaning that the SOC signal is dependent on the turn-on time of the previous cycle and is generated at half the turn-on time of the previous PWM cycle.

Figure 3:
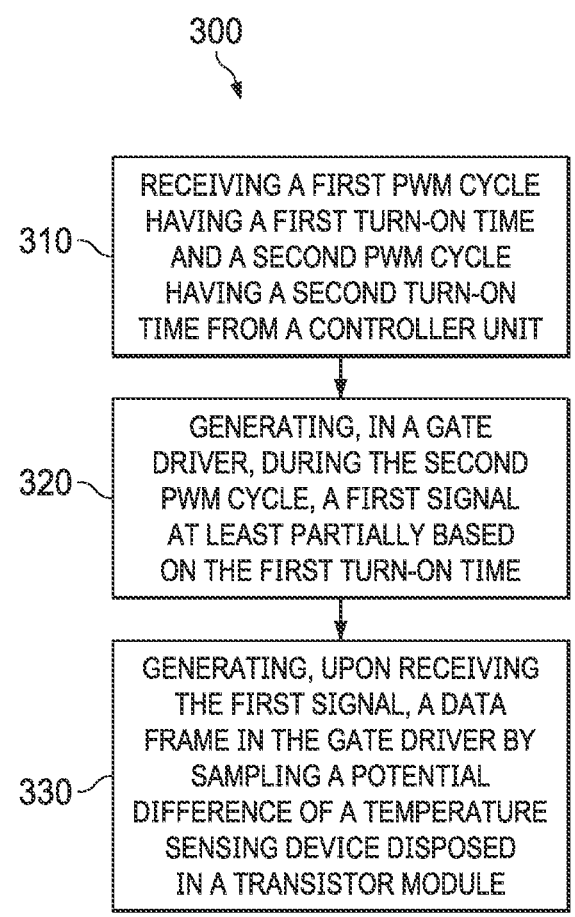
FIG. 3 is a flow diagram of an illustrative method for detecting a temperature of a power transistor disposed in a transistor module, in accordance with various examples.
Figure 4A:
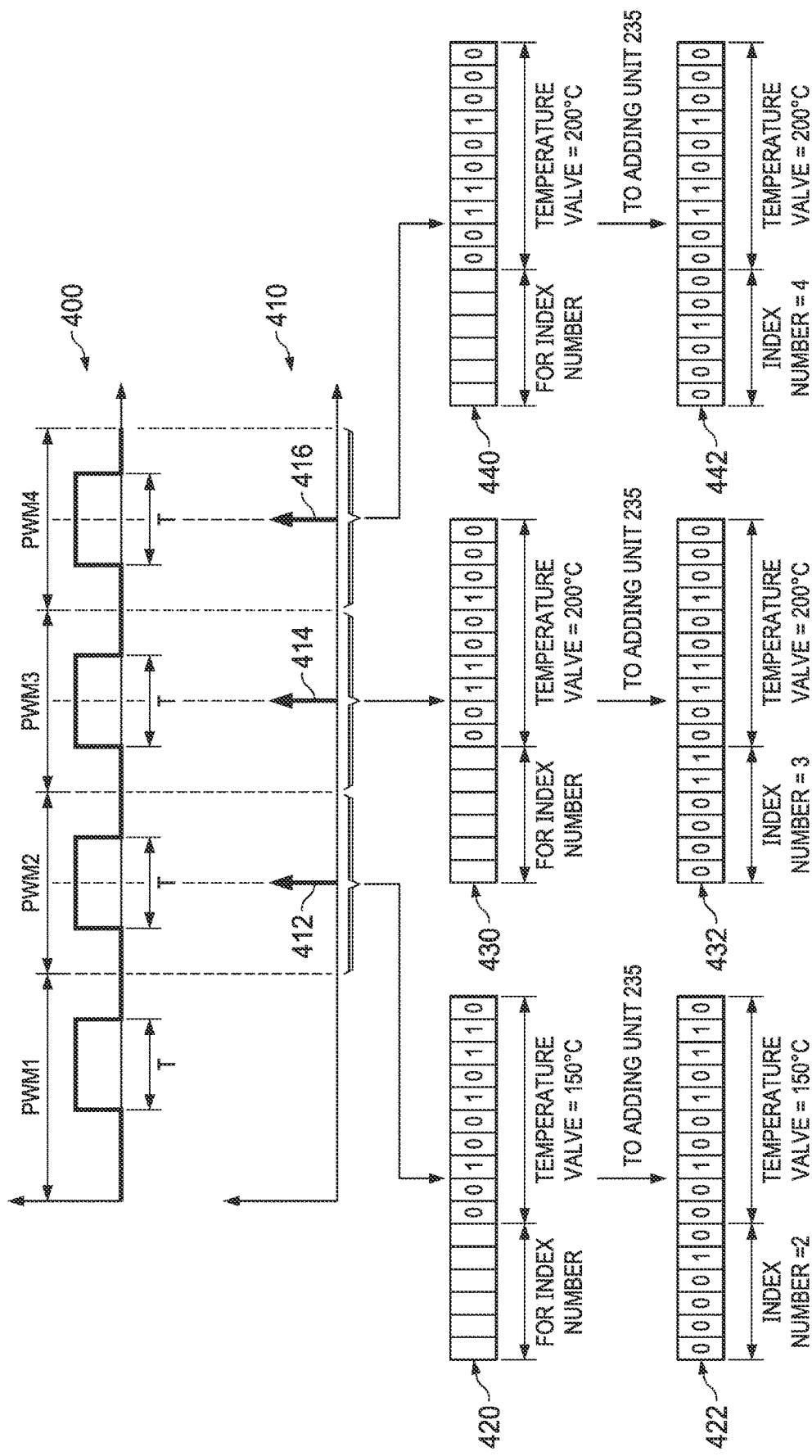
FIG. 4(a) depicts an illustrative sequence of PWM cycles, their corresponding start of conversion (SOC) signals, and data frames, in accordance with various examples.

The operation of the schematic diagram 200 is now described using FIG. 3 and FIG. 4(a). FIG. 3 depicts a method 300 to detect a temperature of the power transistor 127 disposed in the transistor module 119. The method 300 begins with receiving a sequence of PWM cycles (e.g., PWM cycle 1, PWM cycle 2, PWM cycle 3, and PWM cycle 4) from the controller unit 105. The sequence of illustrative PWM cycles is depicted in the timing diagram 400. In this example, the turn-on time duration (e.g., T) of each of the PWM cycles 1, 2, 3, 4 is the same. Stated another way, the method 300 begins with step 310 that includes receiving at least two PWM cycles, for example PWM cycle 1 and PWM cycle 2, with each PWM cycle having its own turn-on time (e.g., turn-on time T). The method 300 then moves to step 320 with generating, in the gate driver 118, an SOC signal that is at least partially based on the turn-on time of the previous PWM cycle. For example, the SOC signal 412 (timing diagram 410) is based on the turn-on time of PWM cycle 1, the SOC signal 414 is based on the turn-on time of the PWM cycle 2, and the SOC signal 416 is based on the turn-on time of the PWM 3 cycle.

Upon receiving the SOC signal from the duty cycle measurement circuit 225, the ADC circuit 230 begins receiving the potential across the diode 211 for the time the SOC signal is supplied to the reference terminal 233, and generating a data frame related to the received potential across the diode 211. For example, if the SOC signal is on for 1 microsecond, the ADC circuit 230 receives the potential difference value of the diode 211 for 1 microsecond. Because the ADC circuit 230 converts the received analog signal into a digital signal, the ADC circuit 230 generates a bit-populated data frame by sampling the received potential (step 330).

Examples of such data frames are depicted in FIG. 4(a). A data frame 420 shows the multi-bit (e.g., 16-bit) output of the ADC circuit 230 for the PWM 2 cycle, which includes six bits that are yet to be populated with the digital representation of the index number 2 of the PWM 2 cycle and the other 10 bits that are populated with the digital representation of the temperature value of the power transistor 127 sampled by the ADC circuit 230 (e.g., 150 degrees Celsius). Similar to the data frame 420, data frames 430 and 440 depict the outputs of the ADC circuit 230 for their corresponding PWM cycles. In the above-mentioned example, the ADC circuit 230 provides a 16-bit output. The size (e.g., 4 bit, 8 bit, 16 bit, etc.) of the ADC circuit 230 output depends on the application in which the ADC circuit 230 is used.

The data frames generated by the ADC circuit 230, in some examples, are received by the adding unit 235 where digital bits representative of the index number of their corresponding PWM cycle are concatenated. For example, the adding unit 235 first receives the data frame 420 from the duty cycle measurement circuit 230, and the data frame 420 is yet to be populated with the index values of the PWM cycle 2. The adding unit 235, upon receiving the data frame 420, populates the 6 bits reserved for index values with the index value of the PWM cycle during which the data frame 420 is generated, e.g., with the digital representation of the index number 2 (as shown in data frame 422). Similarly, the data frames 432 and 442 are generated by the adding unit 235 using the binary versions of the index numbers of their corresponding PWM cycles. In some examples, in order to concatenate the index values, the adding unit 235 receives counter information from the duty cycle measurement circuit 225. The output data frames of the adding circuit 235 are transported to the controller unit 105, in some examples, using the SPI interface 240.

Figure 4B:
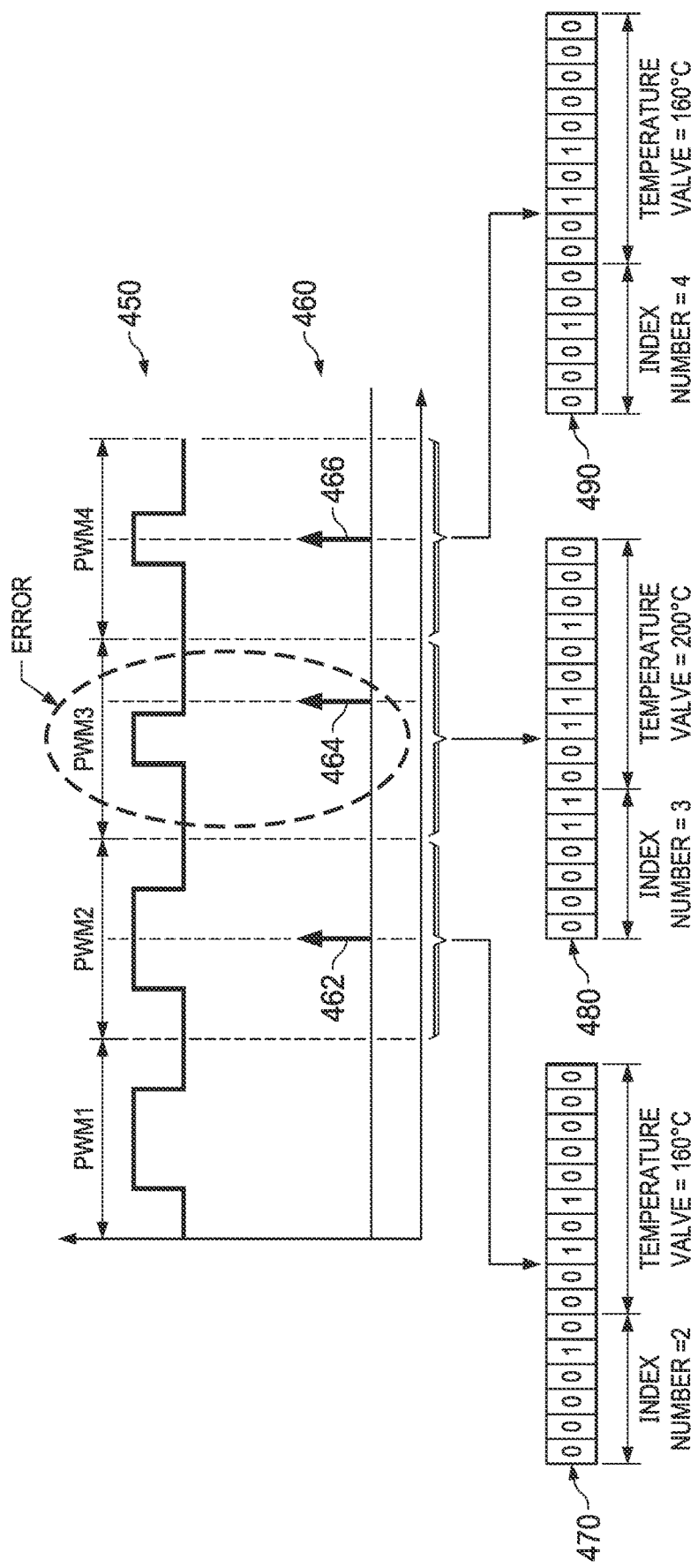
FIG. 4(b) depicts another illustrative sequence of PWM cycles, their corresponding start of conversion (SOC) signals, and data frames, in accordance with various examples.

In some examples, the turn-on time durations of two PWM cycles may differ, and such a scenario is depicted in FIG. 4(b). FIG. 4(b) shows an illustrative timing diagram 450 of a sequence of PWM cycles 1, 2, 3, 4, out of which PWM cycle 1 and PWM cycle 2 are of substantially similar turn-on time duration and PWM 3 and PWM 4 are of substantially similar turn-on time duration, which is different than the turn-on time duration of PWM cycles 1 and 2. FIG. 4(b) also depicts the data frames 470, 480, and 490 generated by the adding unit 235 for the PWM cycles 2, 3, and 4, respectively. Based on the turn-on time of PWM cycle 1, an SOC signal 462 is generated for the PWM cycle 2. Similarly, based on the turn-on time of PWM cycle 2, an SOC signal 464 is generated for PWM cycle 3. Since the SOC signal 464 is dependent on the turn-on time of PWM cycle 2, and because the turn-on times of PWM cycle 2 and PWM cycle 3 are different, the sampling done by the ADC circuit 230 upon receiving the SOC signal 464 will be during the turn-off time (erroneous position) of the PWM cycle 3. Therefore, the data frame 480 generated by the ADC circuit 230 and the adding unit 235 for the PWM cycle 3 will be flawed.

The erroneous data frames received by the controller unit 105 should be discarded. In some examples, this is done by comparing the duty cycles of PWM signals sent by the controller unit 105 to the gate driver 118. For example, the controller unit 105, while sending the PWM signal to the gate driver 118, may calculate the duty cycle of each of the PWM cycles and store it locally in the controller unit 105. These stored duty cycles may be indexed with the index number of each of the PWM cycles. In order to discard the erroneous data frame received by the gate driver 118, the controller unit 105 finds the differential of two consecutive duty cycles, and if the differential is approximately zero, or within a target margin of error, the controller unit 105 decides to keep the data frame. However, if the differential is outside the target margin of error (e.g., 5%), the controller unit 105 decides to discard the received data frame, deeming it erroneous. For example, referring again to FIG. 4(b), the differential of the duty cycle of the PWM cycle 2 (e.g., 0.6) and PWM cycle 3 (e.g., 0.4) calculated by the controller unit 105 may be higher (e.g., 0.6-0.4=0.2) than the margin of error (e.g., 0.01) programmed in the controller unit 105, and therefore the data frame 480 should be discarded. On the other hand, the differential of the duty cycle of the PWM cycle 3 (e.g., 0.4) and PWM cycle 4 (e.g., 0.4) in the controller unit 105 may be equal to or within the margin of error (e.g., 0.01). Thus, the data frame 490 is stored.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Similarly, a device that is coupled between a first component or location and a second component or location may be through galvanic isolation. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A gate driver, comprising:
a duty cycle measurement circuit having a duty cycle input and a duty cycle output, wherein the duty cycle measurement circuit is configured to provide a start of conversion (SOC) signal at the duty cycle output, and the duty cycle measurement circuit includes:
a flip-flop having a flip-flop input and a flip-flop output, wherein the flip-flop input is coupled to the duty cycle input;
a counter having a counter input and a counter output, wherein the counter input is coupled to the flip-flop output;
a shift register having a shift input and a shift output, wherein the shift input is coupled to the counter output; and
a comparator having first and second comparator inputs and a comparator output, wherein the first comparator input is coupled to the shift output; and
an analog to digital converter (ADC) having an ADC input, an ADC output, and a reference terminal, wherein the reference terminal is coupled to the duty cycle output.

2. The gate driver of claim 1, further comprising a current source coupled to the ADC input.

3. The gate driver of claim 1, wherein the duty cycle measurement circuit is configured to:
receive a pulse width modulated (PWM) signal; and
produce the SOC signal responsive to a turn-on time of the PWM signal.

4. The gate driver of claim 1, wherein the gate driver is adapted to be coupled to a control terminal of a transistor in a transistor module, and the ADC input is adapted to be coupled to a temperature sensitive device in the transistor module.

5. The gate driver of claim 4, wherein the ADC is configured to:
sample a voltage across the temperature sensitive device in response to receiving the SOC signal; and
produce a data frame responsive to the sampled voltage across the temperature sensitive device.

6. The gate driver of claim 5, wherein the data frame includes an indication of the sampled voltage across the temperature sensitive device.

7. The gate driver of claim 5, wherein the temperature sensitive device is a diode.

8. The gate driver of claim 1, further comprising an isolator coupled between the duty cycle input and the ADC output.

9. The gate driver of claim 8, further comprising:
a communication interface having first and second communication ports, wherein the first communication port is coupled to the isolator; and
an adding unit having an adding unit input and an adding unit output, wherein the adding unit output is coupled to the second communication port through the isolator, and the adding unit input is coupled to the ADC output.

10. The gate driver of claim 9, further comprising a controller unit coupled to the second communication port.

11. A method of gate driving, the method comprising:
receiving, by a duty cycle measurement circuit, a pulse width modulation (PWM) signal;
producing, by the duty cycle measurement circuit, a start of conversion (SOC) signal based on a turn-on time of the PWM signal;
receiving, by an analog to digital converter (ADC), an analog signal indicating a voltage across a temperature sensitive device; and
producing, by the ADC in response to receiving the SOC signal, a digital signal representative of the analog signal.

12. The method of claim 11, wherein the temperature sensitive device is in proximity to and indicating a temperature of a transistor.

13. The method of claim 12, further comprising providing, by a current source, a current signal to the temperature sensitive device.

14. The method of claim 11, further comprising:
receiving, by an adding unit, information pertaining to the PWM signal and the digital signal; and
concatenating, by the adding unit, the information pertaining to the PWM signal and the digital signal to produce a combined signal.

15. The method of claim 14, further comprising communicating the combined signal over a communication interface between the adding unit and a controller.

16. A system for transistor gate drive, comprising:
a gate driver comprising:
a duty cycle measurement circuit having a duty cycle input and a duty cycle output, wherein the duty cycle measurement circuit is configured to provide a start of conversion (SOC) signal at the duty cycle output, and the duty cycle measurement circuit includes:
a flip-flop having a flip-flop input and a flip-flop output, wherein the flip-flop input is coupled to the duty cycle input;
a counter having a counter input and a counter output, wherein the counter input is coupled to the flip-flop output;
a shift register having a shift input and a shift output, wherein the shift input is coupled to the counter output; and
a comparator having first and second comparator inputs and a comparator output, wherein the first comparator input is coupled to the shift output;
an analog to digital converter (ADC) having an ADC input, an ADC output, and a reference terminal, wherein the reference terminal is coupled to the duty cycle output, and the ADC input is coupled to a temperature sensitive device; and
an adding unit having first and second adding unit inputs and an adding unit output, wherein the first adding unit input is coupled to the ADC output, and the second adding unit input is coupled to the duty cycle output;
a communication interface coupled to the adding unit output through a galvanic isolator; and
a controller unit coupled to the communication interface.

17. The system of claim 16, wherein the controller unit is coupled to the duty cycle input.

18. The system of claim 16, wherein the gate driver further comprises a current source coupled to the ADC input.

19. The system of claim 16, wherein the duty cycle measurement circuit is configured to:
receive a pulse width modulated (PWM) signal; and
produce a start of conversion (SOC) signal responsive to a turn-on time of the PWM signal.

20. The system of claim 16, wherein the gate driver is coupled to a transistor in a transistor module, and the temperature sensitive device is included in the transistor module.

\* \* \* \* \*